(12) United States Patent
Rowe

(10) Patent No.: US 8,518,288 B2
(45) Date of Patent: Aug. 27, 2013

(54) SYNTHESIS OF NANOCOMPOSITE THERMOELECTRIC MATERIAL

(75) Inventor: Michael Paul Rowe, Pinckney, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 289 days.

(21) Appl. No.: 13/023,746

(22) Filed: Feb. 9, 2011

(65) Prior Publication Data

US 2012/0025154 A1 Feb. 2, 2012

Related U.S. Application Data

(63) Continuation-in-part of application No. 12/843,954, filed on Jul. 27, 2010.

(51) Int. Cl.
*H01B 13/00* (2006.01)
*H01B 1/02* (2006.01)
*B82B 3/00* (2006.01)

(52) U.S. Cl.
USPC ........ 252/62.3 T; 428/403; 977/775; 977/833

(58) Field of Classification Search
USPC ............. 252/62.3 T; 977/775, 833; 428/403
See application file for complete search history.

(56) References Cited

U.S. PATENT DOCUMENTS

| | | |
|---|---|---|
| 5,879,715 A | 3/1999 | Higgins et al. |
| 6,482,517 B1 | 11/2002 | Anderson |
| 6,548,264 B1 | 4/2003 | Tan et al. |
| 7,332,351 B2 | 2/2008 | Tan et al. |
| 2005/0281884 A1 | 12/2005 | Adair et al. |
| 2008/0095852 A1 | 4/2008 | Kong et al. |
| 2010/0215852 A1* | 8/2010 | Rowe et al. ................ 427/213.3 |

* cited by examiner

*Primary Examiner* — Carol M Koslow
(74) *Attorney, Agent, or Firm* — Gifford, Krass, Sprinkle, Anderson & Citkowski, P.C.

(57) ABSTRACT

A process for forming thermoelectric nanoparticles includes the steps of forming a core material reverse micelle or micelle, adding a bismuth containing compound to the core material reverse micelle or micelle forming a reverse micelle or micelle having the bismuth containing compound dispersed therein, adding a tellurium containing compound with the formed micelle or reverse micelle in the presence of a reducing agent that alloys with the bismuth containing compound forming composite thermoelectric nanoparticles having a core and shell structure, and washing the core and shell nanoparticles in a solvent mixture including ammonium hydroxide, water and methanol wherein the core and shell nanoparticles remain un-agglomerated and have a particle size of from 1-25 nanometers.

19 Claims, 16 Drawing Sheets

Core material + Bismuth compound + tellurium compound

SYNTHESIS OF NANOCOMPOSITE THERMOELECTRIC MATERIAL

CROSS-REFERENCE TO RELATED APPLICATIONS

This application is a continuation-in-part of U.S. patent application Ser. No. 12/843,954 filed Jul. 27, 2010.

FIELD OF THE INVENTION

The invention relates to thermoelectric nanoparticles and in particular to a process for producing thermoelectric composite nanoparticles and thermoelectric nanocomposite materials.

BACKGROUND OF THE INVENTION

Thermoelectric materials and devices may be utilized to obtain electrical energy from a thermal gradient. Current thermoelectric materials have a limited thermoelectric conversion efficiency which may be defined in terms of the formula $ZT=TS^2\gamma/\kappa$. The ZT of the above formula or figure of merit is related on the macroscopic transport parameters of the material including the Seebeck coefficient S, the electrical conductivity $\gamma$ and the thermal conductivity $\kappa$.

In order to improve the thermoelectric conversion efficiency one may increase the Seebeck coefficient and electrical conductivity while lowering the thermal conductivity. Increasing the ZT is difficult as the three parameters S, $\gamma$ and $\kappa$ are interrelated. For example, doping of a specific material may increase the electrical conductivity while decreasing the Seebeck coefficient and increasing the thermal conductivity. There is therefore a need in the art for a material having a ZT improved over current prior art materials. There is also a need in the art for increasing the thermoelectric conversion by increasing or maintaining the Seebeck coefficient and electrical conductivity while lowering a thermal conductivity.

Nanostructured materials may be utilized to produce thermoelectric nanoparticles and materials that may be utilized to form a thermoelectric composite material. However, such nanostructured materials may be difficult and expensive to manufacture and may be difficult to process to form a composite material. There is therefore a need in the art for a thermoelectric nanostructured material and a process for producing the same that produces materials having an increased thermoelectric conversion efficiency. Additionally, there is a need in the art for a process for producing the thermoelectric nanoparticles that is cost efficient and scalable. Further, there is a need in the art for a process for producing thermoelectric composites having improved properties and maintains a desired particle size that overcomes technical problems of manufacturing in the prior art.

SUMMARY OF THE INVENTION

In one aspect, there is disclosed a process for forming thermoelectric nanoparticles that includes the steps of forming a core material reverse micelle or micelle, adding at least one shell material having a metal cation to the core material reverse micelle or micelle in the presence of a reducing agent that alloys with the metal cation forming composite thermoelectric nanoparticles having a core and shell structure, and washing the core and shell nanoparticles in a solvent mixture including ammonium hydroxide, water and methanol wherein the core and shell nanoparticles remain un-agglomerated and have a particle size of from 1-25 nanometers.

In a further aspect, there is disclosed a process for forming thermoelectric materials that includes the steps of forming a core material reverse micelle or micelle, adding at least one shell material having a metal cation to the core material reverse micelle or micelle in the presence of a reducing agent that alloys with the metal cation forming composite thermoelectric nanoparticles having a core and shell structure, washing the core and shell nanoparticles in a solvent mixture including ammonium hydroxide, water and methanol wherein the core and shell nanoparticles remain un-agglomerated and have a particle size of from 1-25 nanometers, and forming a nanocomposite material following the formation of the composite thermoelectric nanoparticles wherein the nanocomposite material includes a network of the shell material including inclusions of the core material nanoparticles.

DETAILED DESCRIPTION OF THE PREFERRED EMBODIMENTS

Figure 1:
FIG. 1 is a graphical depiction of the steps of one embodiment of the invention.

Referring to FIG. 1, there is shown a first embodiment of a process for forming thermoelectric nanoparticles that includes the steps of providing a core material and a bismuth containing compound in a basic solution, providing a tellurium containing compound, and reacting the bismuth containing compound with the tellurium containing compound in the presence of a base forming thermoelectric nanoparticles. In one aspect, the bismuth containing solution has a pH greater than 7.

In one aspect, the bismuth containing compound may be selected from bismuth citrate, ammonium bismuth citrate and other bismuth salts soluble in a basic solution. As stated above, the bismuth containing compound is preferably soluble in a pH of the basic range.

In one aspect, the tellurium containing compound may be selected from tellurium salts and sodium tellurium hydride. Additionally, tellurium powder may be utilized directly to synthesize a tellurium reducing-agent in situ.

The bismuth containing compound such as bismuth citrate will react with the tellurium containing compound such as sodium tellurium hydride to spontaneously alloy about a core material particle. In one aspect, the core material may be selected from various materials including: $SiO_2$, metals, semiconductors, insulators, ceramics, carbon, polymers, salts or combinations thereof and ceramic materials including alumina, titanium dioxide, and zirconium oxide and a shell selected from $Bi_2Te_3$, chalcogenide semiconductors including bismuth telluride and lead telluride, metals, semi-metals including binary, ternary and quaternary alloys of conductors, semiconductors, and insulators, compounds of silicon and germanium, skutterudite materials including $CoSb_3$ materials, rare earth intermetallics including $YbAl_3$, clathrate structured materials including silicon germanium or SN framework based materials, $Mg_2Si$ and doped forms of $Mg_2Si$, half heusler alloys including MNiSn materials where M may represent Zr, Hf and Ti, multicomponent metal oxides including $NaCo_2O_4$, $Ca_3Co_4O_9$, and thermoelectric materials and doping materials including groups III, IV, V, VI, and VII elements, oxides of such elements, alloys, and salts.

The process may also include the steps of providing various dopants that are desirable in a thermoelectric material. The process may include the steps of providing P-type and N-type dopants to the final thermoelectric compound. In one aspect, the process may include the step of providing a P-type dopant with the bismuth containing compound. Various P-type dopants may be included such as antimony, antimony salt, and potassium antimony tartrate. Additionally, the process may include the step of providing an N-type dopant with the tellurium containing compound. In one aspect, the N-type dopants may be selected from various compounds including selenium and sodium selenium hydride.

Figure 2:
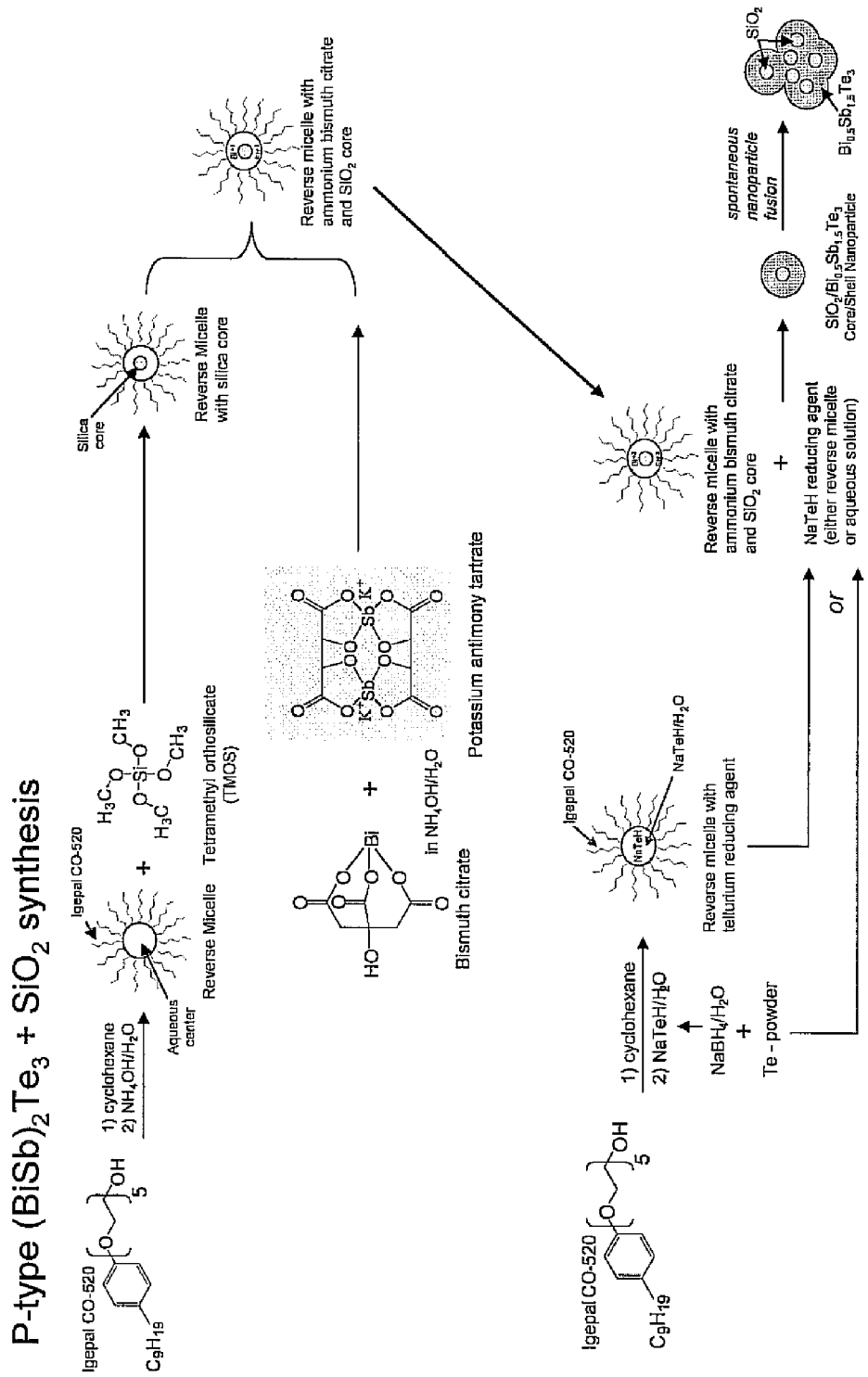
FIG. 2 is a graphical depiction of the steps of another embodiment.
Figure 3:
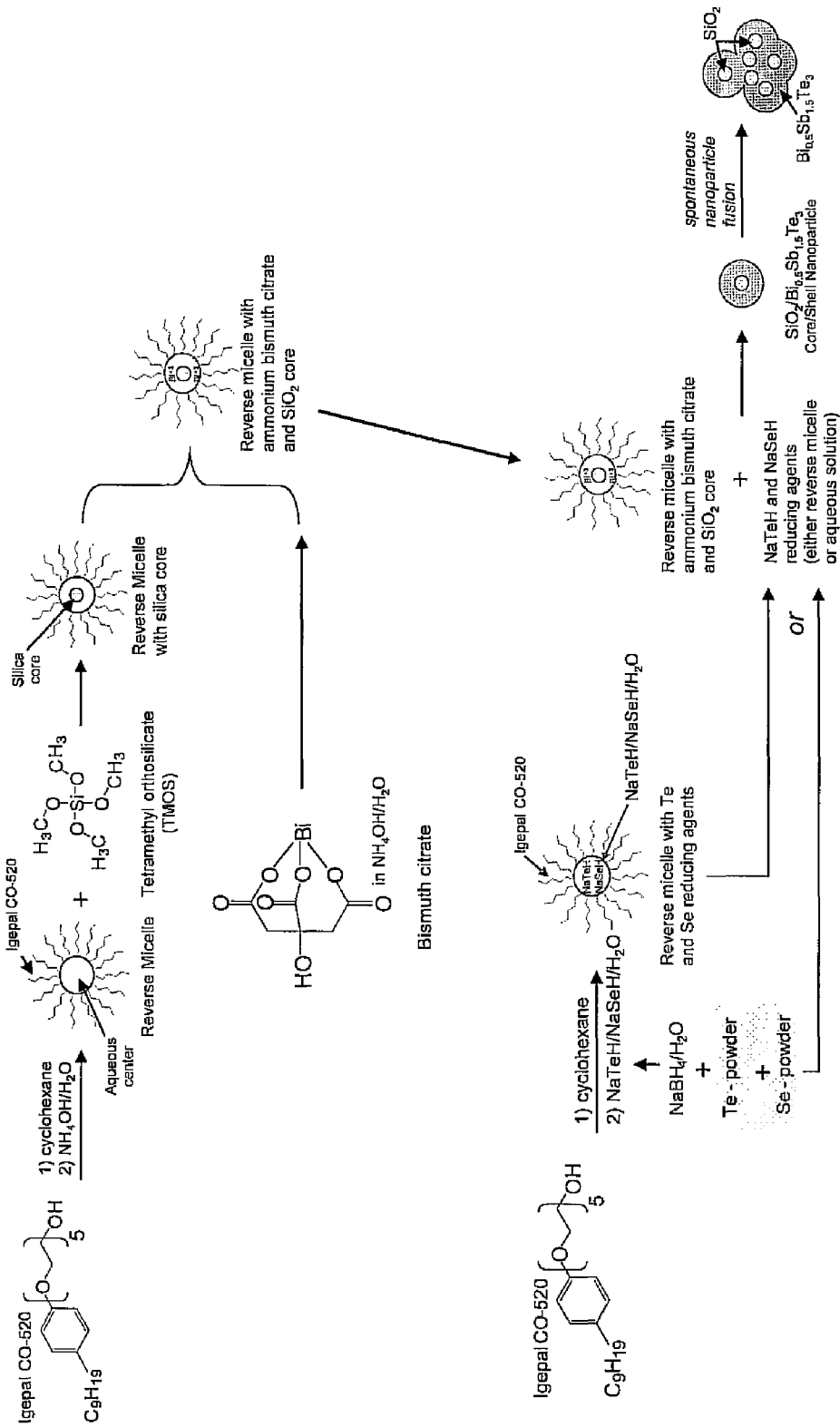
FIG. 3 is a graphical depiction of the steps of a further embodiment.

In one aspect, the process as disclosed in FIGS. 2 and 3 may include the use of micelles and/or reverse micelles. In one aspect, the process may include the steps of forming a core material reverse micelle or micelle, adding the bismuth containing compound to the core material reverse micelle or micelle forming a reverse micelle or micelle having the bismuth containing compound dispersed therein, adding the tellurium containing compound with the formed micelle or reverse micelle in the presence of a reducing agent that alloys with the bismuth containing compound forming composite thermoelectric nanoparticles having a core and shell structure. As with the process described above. P-type and N-type dopants may be included with the bismuth containing compound and the tellurium containing compound respectively. Additionally, the tellurium containing compound may be introduced by the formation of a reverse micelle or micelle having the tellurium containing compound dispersed therein. The N-type dopant as described above may be added with the tellurium containing compound for dispersion within a reverse micelle or micelle or may be added separately.

The process may also include the step of combining the reverse micelles or micelles having the bismuth containing compound with the reverse micelles or micelles having the tellurium compound dispersed therein.

The step of forming a core material micelle or reverse micelle may include the steps of dissolving a surfactant in an organic solvent or aqueous solution and then adding an aqueous phase or an organic phase to the dissolved surfactant and then adding a core material forming a core material nanoparticle dispersed in an aqueous portion of the reverse micelle or micelle. Additionally, additional steps selected from the following group may also be performed. The group may include: adjusting the pH to initiate a core formation reaction; introducing a reagent to initiate a core formation reaction; irradiating or heating to initiate a core formation reaction; adjusting the pH to stabilize the system; direct addition of a core structure or structures to the reverse micelles or micelles; adding a core material to the material forming core material nanoparticles dispersed in an aqueous portion of the reverse micelle or micelle.

In another aspect, the step of forming a micelle or reverse micelle having the bismuth containing compound dispersed therein may include the steps of dissolving a surfactant in a solvent or aqueous solution, adding the bismuth containing material to the dissolved surfactant forming a reverse micelle or micelle having a solvent or an aqueous portion including the bismuth containing material. Additionally, further materials may be dissolved in the surfactant such as the dopants described above such that the dopant and bismuth containing material are dissolved in the surfactant forming a micelle or reverse micelle having an aqueous portion including the additional material.

Alternatively, the step of forming a core material micelle or reverse micelle may include the steps of dissolving a surfactant in a solvent, adding ammonium hydroxide to the solvent and adding tetramethyl orthosilicate to the material forming silicon dioxide nanoparticles dispersed within an aqueous portion of the micelle or reverse micelle. Following the formation of the micelle or reverse micelle, the bismuth containing compound may be introduced into the micelle or reverse micelle.

Additionally, the core material may already be formed as a nanoparticle and added either directly, in a solution, or within a micelle or reverse micelle.

As stated above, bismuth citrate may be utilized as the bismuth containing compound and dissolves with a surfactant to form the micelle or reverse micelle. Additionally, the tellurium micelle or reverse micelle may be formed by utilizing sodium tellurium hydride that is dissolved in the surfactant to form the micelle, described above. When the bismuth citrate micelle is combined with the tellurium micelle, bismuth ions of the bismuth citrate are reduced to bismuth metal in the presence of tellurium wherein a spontaneous alloying step occurs about the core nanoparticles.

Following the formation of the core and shell nanoparticle composite, the core and shell nanoparticle composite may be washed in a solvent mixture maintaining the size of the nanoparticles and preventing agglomeration of the nanoparticles. The solvent mixture may include ammonium hydroxide, water and methanol in a desired ratio. In one aspect, the solvent mixture includes ammonium hydroxide from 0.29 to 0.59 percent by volume relative to a total volume, water from 10 to 20 percent by volume relative to a total volume and methanol from 80 to 90 percent by volume relative to a total volume. In a further aspect, the solvent mixture includes ammonium hydroxide at 0.4 percent by volume relative to a total volume, water at 14.94 percent by volume relative to a total volume and methanol at 84.66 percent by volume relative to a total volume. The step of washing the nanoparticles in the solvent mixture the in the specified ranges prevents agglomeration of the nanoparticles and maintains the nanoparticles in a desired size range of from 1 to 25 nanometers. Deviation from the ranges outlined above may result in potential agglomeration of the nanoparticles resulting in micro sized particles.

Following the formation of the thermoelectric nanoparticles and the washing step, the material may be formed into a nanocomposite material for use in thermoelectric devices. In one aspect, the forming step may include sintering the composite thermoelectric nanoparticles forming a network of the shell material including inclusions of the core material nanoparticles. In another aspect, a step of nanoparticle fusion forming a nanocomposite material is performed following the formation of the composite thermoelectric nanoparticles wherein the nanocomposite material includes a network.

EXAMPLES

The following examples are detailed for various aspects of the process wherein bismuth telluride shell materials are formed about a silicon dioxide core to form composite nanoparticles.

Examples

Either nitrogen or argon gas is used throughout the synthesis to evacuate the reaction of oxygen. To a 250 mL Schlenk flask is added 5.909 g of Te powder, 103 mL of $H_2O$, and a Teflon stir bar. Good results may be achieved using −200 mesh Te powder. Larger mesh powders may also be utilized. To make N-type $Bi_2(TeSe)_3$, Se powder is added at this stage to the flask.

The reaction flask may then be cooled in an ice water bath for 10 mins. 6.235 g of $NaBH_4$ is added in portions under a backflow of inert gas to the reaction stirring briskly. Each portion of $NaBH_4$ is allowed a moment to dissolve before adding additional reducing agent. This is intended to avoid any possible buildup of heat in the reaction flask.

The reaction is allowed to stir under inert gas until all the Te has dissolved. This generally takes from 6 to 8 hours. The water bath is kept in place as a heat sink throughout the NaTeH formation. The time needed for the reaction to go to completion depends on factors such as surface area of the Te powder, rate and effectiveness of stirring, and how quickly the reaction warms up to room temperature. The reaction will go through a series of color changes; ending in a purple liquid with white precipitate. It is common to allow the NaTeH synthesis to run for more than 8 hours, and then use it the next day to successfully make composite nanoparticles.

A 1 L 4-neck round bottom flask is fitted with a Teflon-coated stirring paddle and the appropriate adaptor needed to make an oxygen-free environment in the reaction flask. A stirring paddle is recommended for this reaction scale because very aggressive stirring of the emulsion was found to help the distribution of constituent elements throughout the nanocomposite. The flask is degassed with inert gas.

An emulsion is created next. 23.286 g of Igepal CO-520 and 265 mL of cyclohexane are added to the 1 L round bottom reaction flask. Aggressive stirring with the stirring paddle is begun and maintained throughout the entire synthesis. A solution of 5.36 mL $H_2O$ and 38.8 µL 30% ammonium hydroxide is made and then added to the reaction flask. This emulsion is then stirred for 5 mins 3.35 mL of tetramethyl orthosilicate is added to the emulsion to grow silica nanoparticles in situ.

The reaction is then stirred under an inert atmosphere for at least 4 hours. Reactions have been kept stirring at this stage of the synthesis for up to 15 hours.

After at least 4 hours of stirring the $SiO_2$ nanoparticle synthesis, 3.48 mL 30% ammonium hydroxide is dissolved in 6.02 mL of $H_2O$. Into this ammonium hydroxide solution is dissolved 7.743 g of potassium antimony tartrate trihydrate and 3.088 g bismuth citrate. To make undoped $Bi_2Te_3$ or N-type $Bi_2(TeSe)_3$, the antimony salt is omitted. This solution can require substantial mixing and sonication to fully dissolve all of the antimony and bismuth salts. The antimony and bismuth salts may be added in portions to the ammonium hydroxide solution.

The bismuth solution is then added to the reaction flask containing the $SiO_2$ nanoparticle synthesis. Aggressive stirring is continued under an inert atmosphere.

After the antimony and bismuth solution has been stirred aggressively with the $SiO_2$ nanoparticle synthesis for 10 mins, the reaction is ready for the NaTeH to be added. The NaTeH must first be filtered through a fritted glass filter, again being careful not to expose it to the air. The resulting purple liquid is added quickly dropwise to the 1 L reaction flask containing the bismuth and silica, and antimony when P-type material is being produced. The reaction flask should be stirring as quickly and aggressively as possible to avoid localized concentrations in the synthesis. The filter cake isolated when the NaTeH reaction was filtered is then washed with 25 mL of $H_2O$. This water wash is also filtered through the same fritted glass filter and added to the synthesis quickly dropwise. After all of the NaTeH solution is added to the synthesis, the reaction is stirred for an additional hour under an inert atmosphere.

The emulsion is then broken to help make purification easier. 100 mL of methanol or acetone is stirred into the reaction to precipitate the composite nanoparticles out of the suspension formed by the Igepal CO-520. The composite nanoparticles can then be isolated from the crude product solution by either allowing them to settle on their own or by centrifugation. With either method, the product should not be exposed to air in order to avoid oxide formation. The composite nanoparticles are finally recovered by decanting off the reaction solution.

The composite nanoparticles may then be washed in a solvent mixture of water, ammonium hydroxide and methanol. The solvent mixture includes sodium hydroxide from 0.29 to 0.59 percent by volume relative to a total volume, water from 10 to 20 percent by volume relative to a total volume and methanol from 80 to 90 percent by volume relative to a total volume.

Still being careful to avoid air contacting the composite nanoparticles, the now purified product is transferred, with additional methanol, to a flask for drying. An inert gas stream is blown through the flask over the slurry of purified material to slowly dry it while it is being sonicated. This procedure should take several hours.

Samples of this purified powder may be initially baked at 395° C. for 5 mins under an argon flow. Punch and dies (for sintering the composite nanoparticles) are then loaded in the glove box. The thermoelectric composite nanoparticles may be sintered in a hot press at 395° C. and 50 MPa for 1 hour.

The process described in the examples produces composite nanoparticles having a size of less than 10 nanometers and may include antimony or selenium-doped bismuth telluride with silica inclusions. Bismuth telluride nanoparticles produced by the process are shown in the TEM image of FIG. 4. The XRD spectra of the bismuth telluride are shown in FIG. 5. The XRD data indicates formation of a pure bismuth telluride material.

Figure 4:
FIG. 4 is an TEM image of a thermoelectric material produced by one embodiment and including a bismuth telluride network having silicon dioxide nanoparticles dispersed therein.
Figure 5:
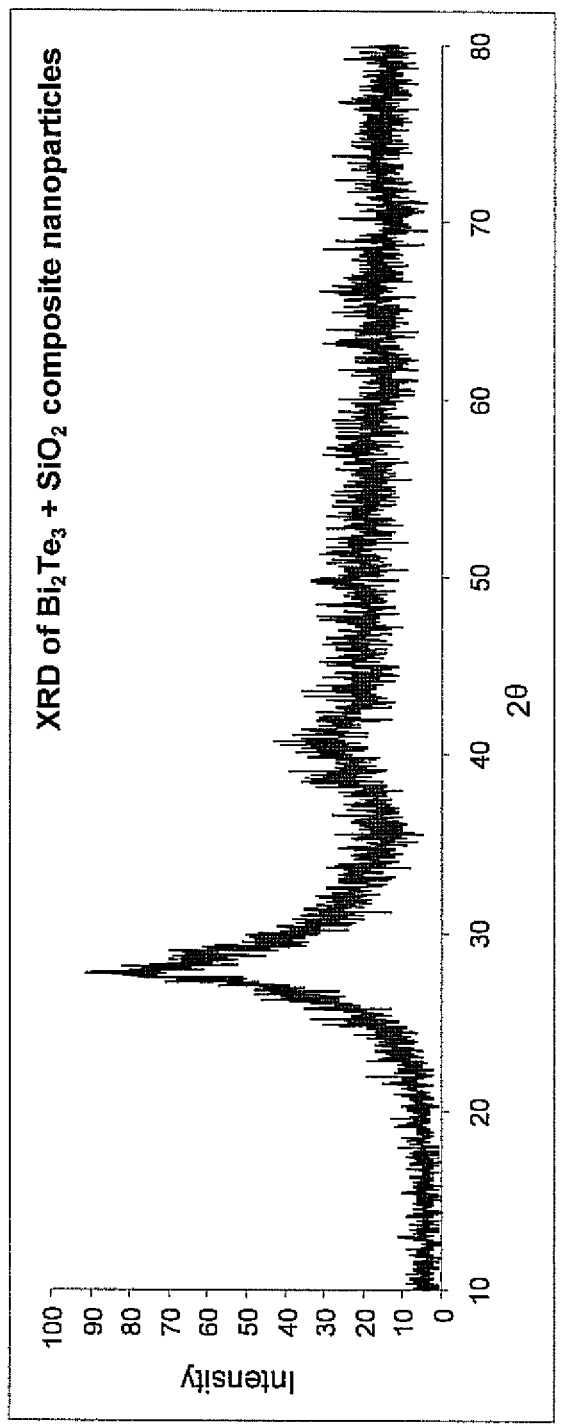
FIG. 5 is an XRD plot of the material of FIG. 4.
Figure 6:
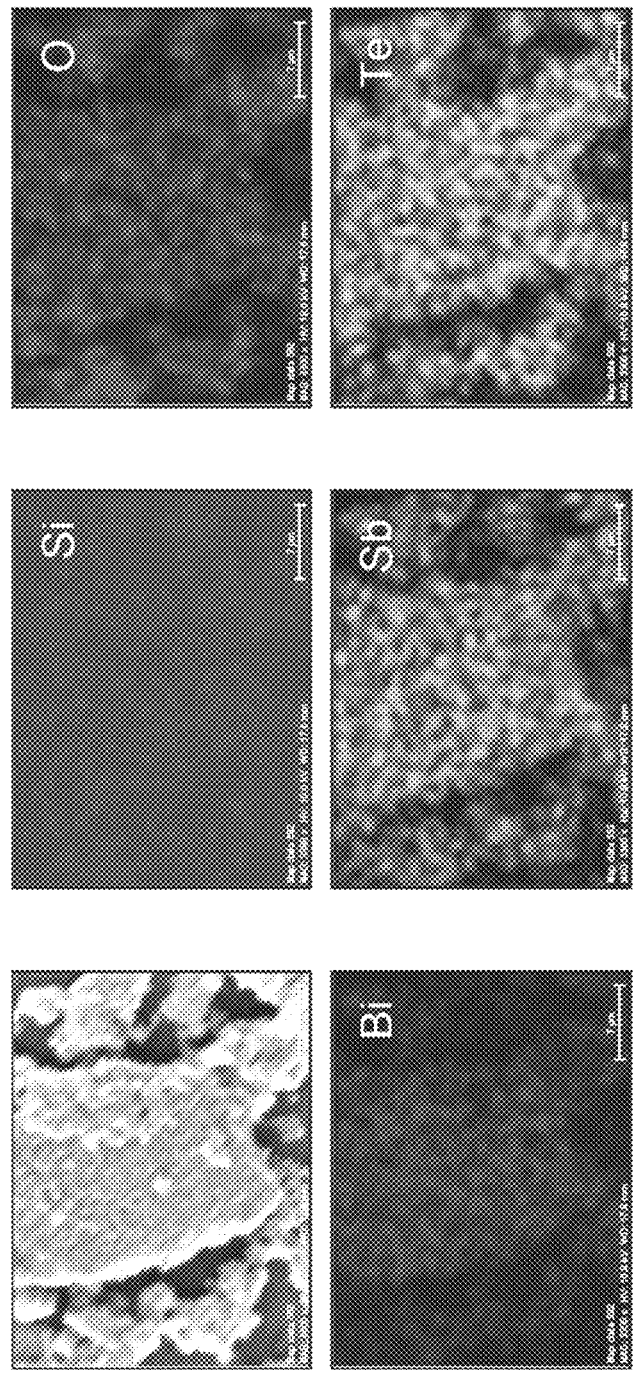
FIG. 6 is an SEM-EDS images of a material formed by the reaction of FIG. 2.
Figure 7:
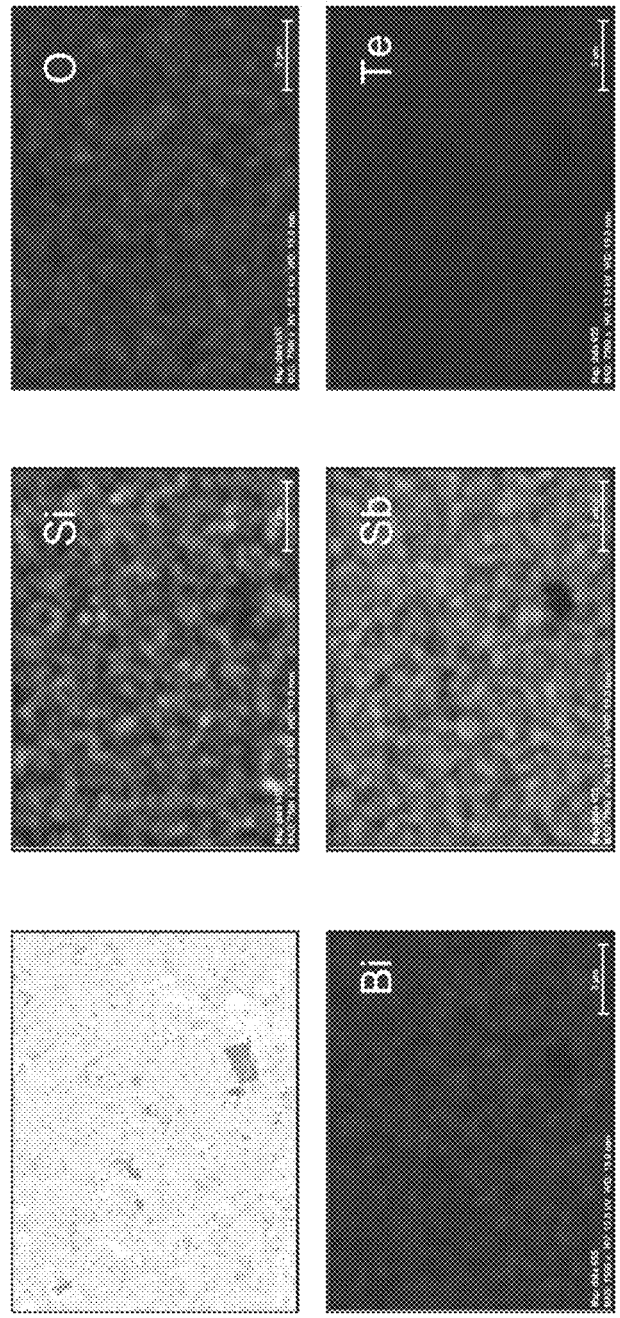
FIG. 7 is an SEM-EDS images of the material of FIG. 6 after being sintered.
Figure 8:
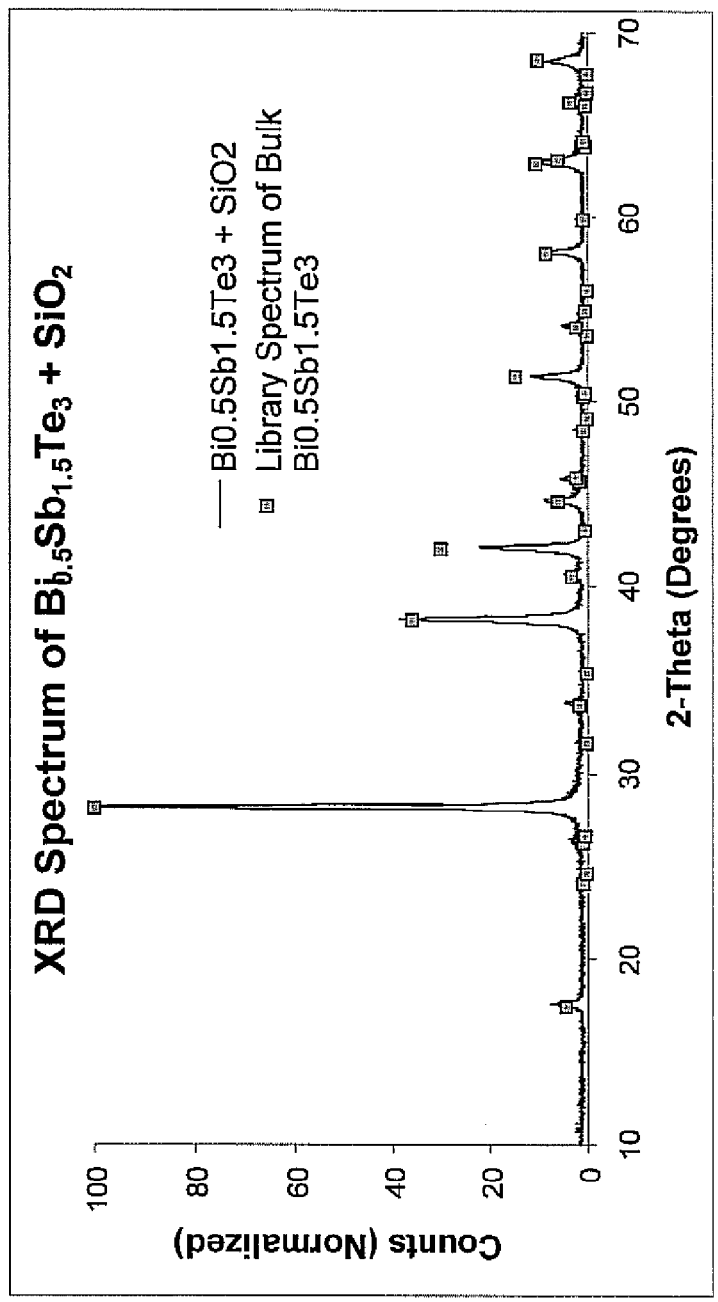
FIG. 8 is an XRD spectrum of a bismuth telluride material including antimony.
Figure 10:
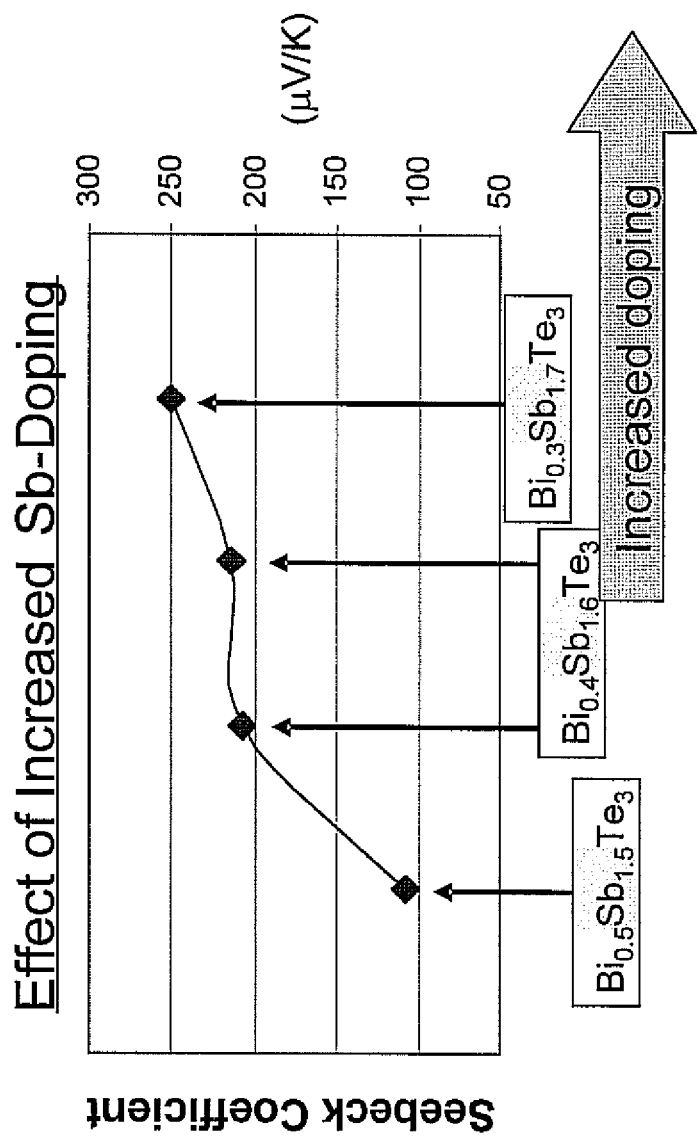
FIG. 10 is a plot showing the effect on the Seebeck Coefficient of increased antimony doping.

In addition to the bismuth telluride material of FIGS. 4 and 5 doped bismuth telluride materials may also be produced. As shown in FIGS. 6-8 a P-type antimony doped material may be produced by the above described procedure. The SEM images of the antimony doped material are shown in FIGS. 6 and 7 both for the material before and after sintering. The SEM images indicate a homogeneous distribution of Sb, Bi, Te, O, and Si species. The XRD data for the antimony doped sample is shown in FIG. 8. The XRD data indicates a pure sample of an antimony doped bismuth telluride in comparison to a known XRD spectrum for the material. The antimony doped bismuth telluride has a Seebeck coefficient measurement of 244 µV/K. FIG. 10 is a figure showing how various levels of antimony doping may vary the Seebeck coefficient. Various materials may be produced to achieve a desired Seebeck coefficient.

Figure 9:
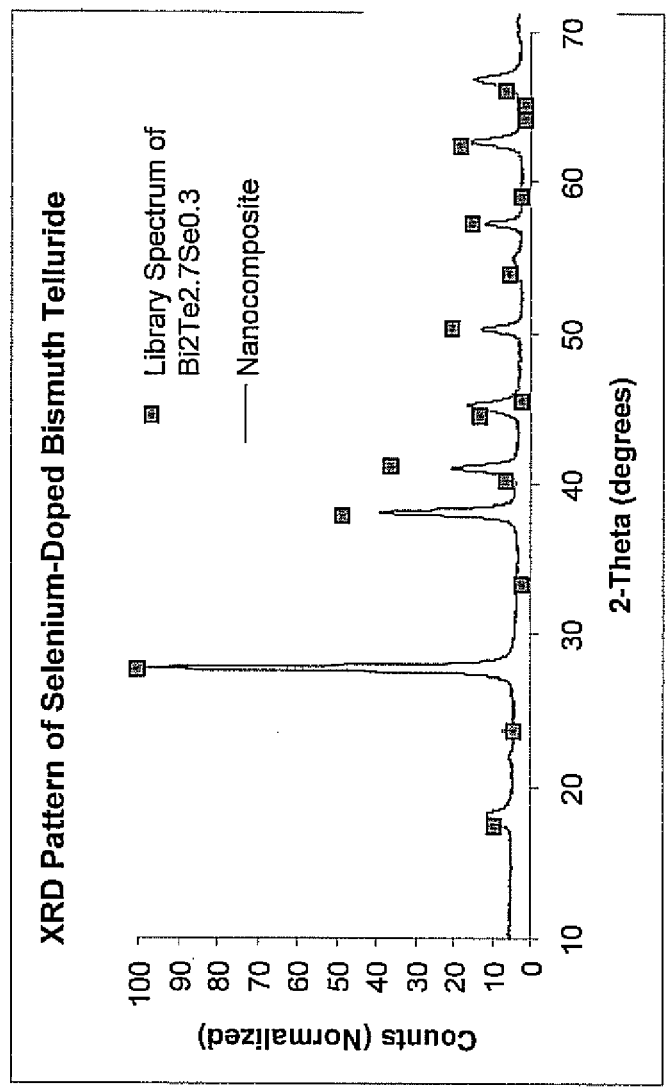
FIG. 9 is an XRD spectrum of a bismuth telluride material including selenium.

Additionally, an N-type doped thermoelectric material may be produced by the procedure outlined in the specification and examples. Selenium may be used as a doping material to produce N-type bismuth telluride material. An XRD spectra of the selenium doped material is shown in FIG. 9.

Figure 11:
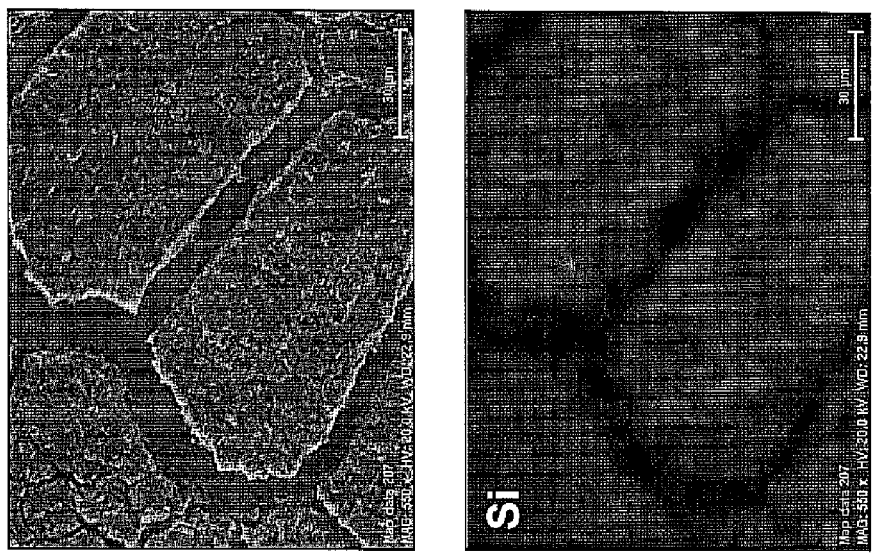
FIG. 11 is an SEM-EDS image of a material formed by the reaction of FIG. 2 and including a washing step using a solvent mixture of ammonium hydroxide at 0.4 percent by volume relative to a total volume, water at 14.94 percent by volume relative to a total volume and methanol at 84.66 percent by volume relative to a total volume.
Figure 12:
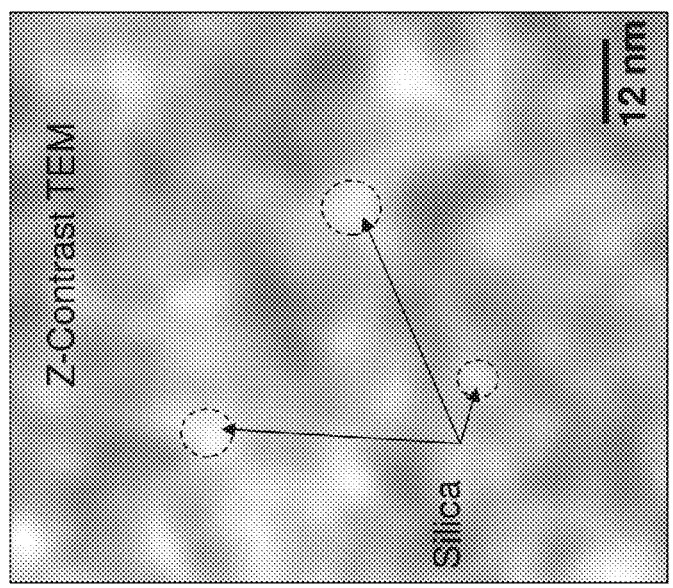
FIG. 12 is a TEM image of a material formed by the reaction of FIG. 2 and including a washing step using a solvent mixture of ammonium hydroxide at 0.4 percent by volume relative to a total volume, water at 14.94 percent by volume relative to a total volume and methanol at 84.66 percent by volume relative to a total volume.
Figure 13:
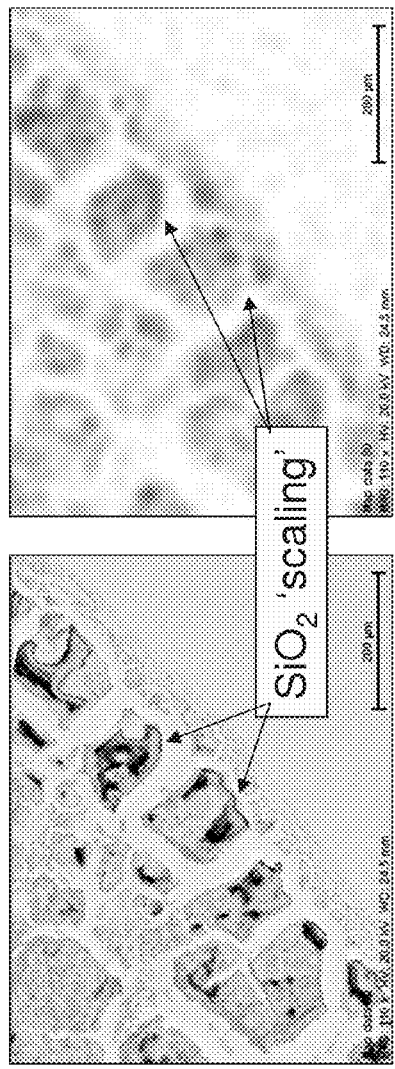
FIG. 13 is an SEM image of a material formed by the reaction of FIG. 2 and including a washing step using water.
Figure 14:
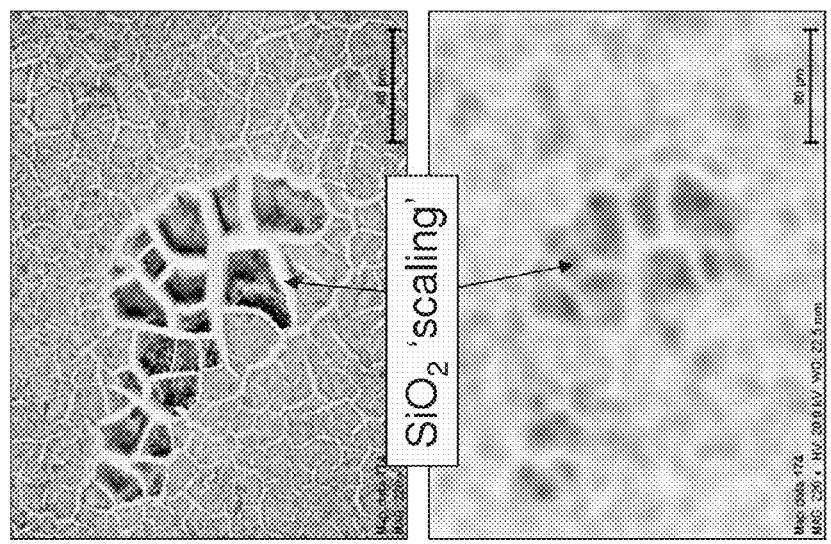
FIG. 14 is an SEM image of a material formed by the reaction of FIG. 2 and including a washing step using a solvent mixture of ammonium hydroxide at 0.4 percent by volume relative to a total volume, water at 10 percent by volume relative to a total volume and methanol at 89.96 percent by volume relative to a total volume.
Figure 15:
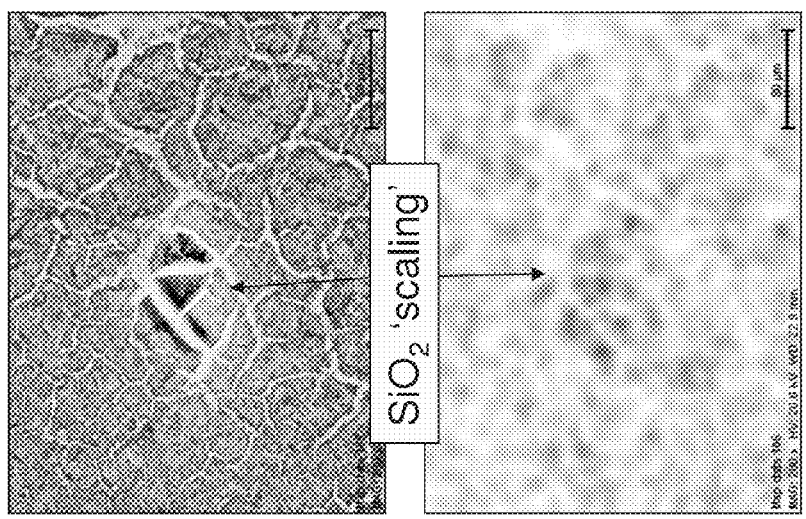
FIG. 15 is an SEM image of a material formed by the reaction of FIG. 2 and including a washing step using a solvent mixture of ammonium hydroxide at 0.2 percent by volume relative to a total volume, water at 10 percent by volume relative to a total volume and methanol at 89.8 percent by volume relative to a total volume.
Figure 16:
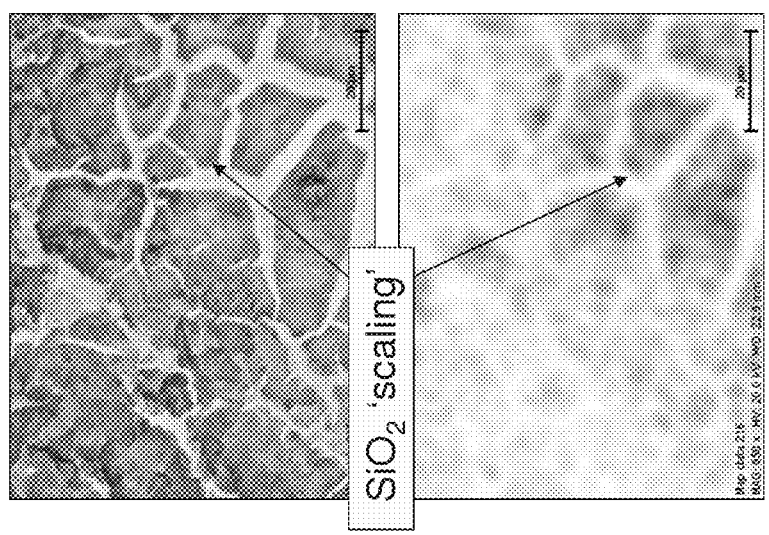
FIG. 16 is an SEM image of a material formed by the reaction of FIG. 2 and including a washing step using a solvent mixture of ammonium hydroxide at 0.4 percent by volume relative to a total volume, water at 19.92 percent by volume relative to a total volume and methanol at 79.68 percent by volume relative to a total volume.

The washing step including the solvent mixture of methanol, water and ammonium hydroxide in the specified ranges produces a product that does not include scaling as seen in an SEM-EDS image of FIG. 11. Additionally, the TEM image as shown in FIG. 12 verifies that the formed from the nanoparticles maintain their nanoscale size and do not agglomerate. Variations of wash conditions outside of the ranges specified in the application result in scaling of the nanoparticles as shown in the SEM-EDS images of FIG. 13-16. The scaling indicates an agglomeration of the silica particles.

The foregoing drawings, discussion and description are illustrative of specific embodiments of the present invention but are not meant to be limitations upon the practice of the invention. Various modifications of the invention will be readily apparent to those of skill in the art in view of the teaching presented above. It is the following claims including all equivalents that define the scope of the invention.

The invention claimed is:

1. A process for forming thermoelectric nanoparticles including the steps of:
   forming a core material reverse micelle or micelle;
   adding a bismuth containing compound to the core material reverse micelle or micelle forming a reverse micelle or micelle having the bismuth containing compound dispersed therein;
   adding a tellurium containing compound with the formed micelle or reverse micelle in the presence of a reducing agent that alloys with the bismuth containing compound forming composite thermoelectric nanoparticles having a core and shell structure;
   washing the core and shell nanoparticles in a solvent mixture including ammonium hydroxide, water and methanol wherein the core and shell nanoparticles remain un-agglomerated and have a particle size of from 1-25 nanometers.

2. The process of claim 1 wherein the solvent mixture includes ammonium hydroxide from 0.29 to 0.59 percent by volume relative to a total volume, water from 10 to 20 percent by volume relative to a total volume and methanol from 80 to 90 percent by volume relative to a total volume.

3. The process of claim 1 wherein the solvent mixture includes ammonium hydroxide at 0.4 percent by volume relative to a total volume, water at 14.94 percent by volume relative to a total volume and methanol at 84.66 percent by volume relative to a total volume.

4. The process of claim 1 wherein the step of adding the bismuth containing compound includes providing a P-type dopant with the bismuth containing compound.

5. The process of claim 1 wherein step of adding the tellurium containing compound includes providing an N-type dopant with the tellurium containing compound.

6. The process of claim 1 wherein step of adding the tellurium containing compound includes forming a reverse micelle or micelle having the tellurium containing compound dispersed therein.

7. The process of claim 6 including providing an N-type dopant with the tellurium containing compound.

8. The process of claim 1 wherein the step of forming a core material micelle or reverse micelle includes the steps of:
   dissolving a surfactant in an organic solvent or aqueous solution;
   adding an aqueous phase or organic phase to the dissolved surfactant;
   adding a core material forming a core material nanoparticle dispersed in an aqueous portion of the reverse micelle or micelle;
   and a step selected from the group consisting of:
      adjusting the pH to initiate a core formation reaction;
      introducing a reagent to initiate a core formation reaction;
      irradiating or heating to initiate a core formation reaction;
      adjusting the pH to stabilize the system;
      direct addition of a core structure or structures to the reverse micelles or micelles; and
      adding a core material to the material forming core material nanoparticles dispersed within the reverse micelle or micelle.

9. The process of claim 1 wherein the step of forming a micelle or reverse micelle having the bismuth containing compound dispersed therein includes the steps of:
   dissolving a surfactant in a solvent or aqueous solution;
   adding the bismuth containing material to the dissolved surfactant forming a reverse micelle or micelle having a solvent or an aqueous portion including the bismuth containing material.

10. The process of claim 9 wherein the step of forming a micelle or reverse micelle having the bismuth containing compound dispersed therein includes the steps of:
    dissolving a surfactant in a solvent or aqueous solution;
    adding a dopant to the dissolved surfactant forming a micelle or reverse micelle having an aqueous portion including the dopant.

11. The process of claim 1 wherein the step of forming a core material micelle or reverse micelle includes the steps of:
    dissolving a surfactant in a solvent;
    adding ammonium hydroxide to the dissolved surfactant;

adding tetramethylorthosilicate to form SiO$_2$ nanoparticles dispersed in an aqueous portion of the micelle or reverse micelle;

adding a core material already in a nanoparticle form.

12. The process of claim 11 wherein the step of forming a bismuth containing compound micelle or reverse micelle includes the steps of:

dissolving a surfactant in a solvent;

adding bismuth citrate to the dissolved surfactant forming a micelle or reverse micelle having an aqueous portion including bismuth citrate.

13. The process of claim 11 wherein the step of forming a telluride micelle or reverse micelle includes the steps of:

dissolving a surfactant in a solvent;

forming a NaTeH material and adding the NaTeH material to the dissolved surfactant forming a micelle or reverse micelle having an aqueous portion including NaTeH.

14. The process of claim 13 including the step of adding bismuth citrate wherein bismuth ions of the bismuth citrate are reduced to bismuth metal in the presence of tellurium wherein a spontaneous alloying occurs about SiO$_2$ core nanoparticles.

15. The process of claim 1 including the steps of:

forming a core material reverse micelle or micelle;

adding bismuth citrate to the core material reverse micelle or micelle forming a reverse micelle or micelle having the bismuth citrate dispersed therein;

adding a tellurium containing compound with the formed micelle or reverse micelle in the presence of a reducing agent that alloys with the bismuth citrate forming composite thermoelectric nanoparticles having a core and shell structure;

washing the core and shell nanoparticles in a solvent mixture including ammonium hydroxide, water and methanol wherein the core and shell nanoparticles remain un-agglomerated and have a particle size of from 1-25 nanometers.

16. The process of claim 15 wherein the step of adding bismuth citrate includes adding potassium antimony tartrate to the core material micelle or reverse micelle.

17. The process of claim 15 wherein step of adding a tellurium containing compound includes adding selenium with the formed micelle or reverse micelle of the step of adding bismuth citrate.

18. The process forming a nanocomposite material including the step of nanoparticle fusion following the formation of the composite thermoelectric nanoparticles of claim wherein the nanocomposite material includes a network.

19. The process of forming a network of the shell material including inclusions of the core material nanoparticles formed according to the process of claim 1, wherein the process includes sintering the composite thermoelectric nanoparticles forming a network of the shell material including inclusions of the core material nanoparticles.

* * * * *

UNITED STATES PATENT AND TRADEMARK OFFICE
CERTIFICATE OF CORRECTION

PATENT NO. : 8,518,288 B2  
APPLICATION NO. : 13/023746  
DATED : August 27, 2013  
INVENTOR(S) : Michael Paul Rowe Page 1 of 1

It is certified that error appears in the above-identified patent and that said Letters Patent is hereby corrected as shown below:

In the Claims

At column 10, claim number 18, line number 19, after claim, Insert --1--.

Signed and Sealed this
Second Day of December, 2014

Michelle K. Lee
*Deputy Director of the United States Patent and Trademark Office*